United States Patent [19]

Dutta et al.

[11] Patent Number: 5,040,033
[45] Date of Patent: * Aug. 13, 1991

[54] OPTICAL AMPLIFIER-PHOTODETECTOR ASSEMBLAGE

[75] Inventors: Niloy K. Dutta, Colonia; Thirumala R. Halemane, Howell; Steven K. Korotky, Toms River, all of N.J.

[73] Assignee: AT&T Bell Laboratories, Murray Hill, N.J.

[*] Notice: The portion of the term of this patent subsequent to Aug. 7, 2007 has been disclaimed.

[21] Appl. No.: 371,473

[22] Filed: Jun. 26, 1989

[51] Int. Cl.$^5$ .................. H01L 31/12; H01L 31/16
[52] U.S. Cl. ........................ 357/19; 357/16; 357/17; 372/43; 372/50
[58] Field of Search ............ 357/16, 17, 19; 372/50, 372/43

[56] References Cited

U.S. PATENT DOCUMENTS

| | | | |
|---|---|---|---|
| 4,470,143 | 9/1984 | Kitamura et al. | 357/19 |
| 4,739,383 | 4/1988 | Maruska et al. | 357/16 |
| 4,759,023 | 7/1988 | Yamaguchi | 357/17 |
| 4,805,178 | 2/1989 | Wilt | 357/17 |
| 4,815,090 | 3/1989 | Usami et al. | 357/19 |
| 4,947,400 | 8/1990 | Dutta | 357/19 |

FOREIGN PATENT DOCUMENTS

| | | | |
|---|---|---|---|
| 59-48975 | 3/1984 | Japan | 372/50 |
| 0125658 | 7/1984 | Japan | 357/17 |
| 59-125660 | 7/1984 | Japan | 372/50 |
| 0125660 | 7/1984 | Japan | |
| 0049285 | 2/1989 | Japan | 357/19 |

OTHER PUBLICATIONS

Liou et al., "Monolithic integrated . . . vapor deposition", Appl. Phys. Lett. 54 (2), 1/9/89.
Hsieh, "GaInAsP/InP Lasers . . . at 1.1–1.3 $\mu$m", IEEE, 12/1978.

*Primary Examiner*—Rolf Hille
*Assistant Examiner*—Minhloan Tran
*Attorney, Agent, or Firm*—Eli Weiss

[57] ABSTRACT

Briefly, in the invention a photodetector and an optical amplifier are integrated in the same semiconductor chip. The optical amplifier and the photodetector are positioned side-by-side on the same chip. A portion of the electromagnetic energy carried in the evanescent tail of the optical mode is detected by the photodetector for monitoring the average output power of the optical amplifier. Current confinement and lateral index guiding can be provided by Fe or Ti doped semi-insulating layers of InP. The side-by-side arrangement enables the detector to monitor the output power of the optical amplifier without degrading the output power of the optical amplifier.

4 Claims, 1 Drawing Sheet

OPTICAL AMPLIFIER | PHOTODETECTOR

OPTICAL AMPLIFIER-PHOTODETECTOR ASSEMBLAGE

TECHNICAL FIELD

This invention relates generally to semiconductor optical amplifiers and more particularly to an optical amplifier integrated on a wafer together with a photodetector monitoring detector.

BACKGROUND OF THE INVENTION

Today's long-haul communication systems are hybrids of optical and electronic components. For example, the repeaters detect light photoelectrically, amplify the resulting current electronically and then use the amplified current to drive a semiconductor laser which again converts the electrical signal back into an optical signal. The optical signal is then carried in an optical fiber to the next repeater in the system where the conversion from optical to electrical and back again to optical is repeated again.

In an all-optical transmission system, light, once generated, will be transmitted optically, amplified optically, and received by optical detection. There is no intermediate conversion from optical to electrical and then back to optical form. Direct optical amplification of an optical signal which results in the elimination of the electronic processing will enable optical communication systems to have repeaters which have higher bandwidths, are physically smaller, simpler in design, more efficient to operate and more economical to produce.

The performance of optical amplifiers is relatively unaffected by changes in the data bit rate and by the presence of additional channels at separate wavelengths, thus allowing for the possibility of upgrading an installed system to a higher capacity by changing only the equipment at the terminals.

Currently, research and development on semiconductor optical amplifiers is aimed at eliminating many of the optical to electrical and electrical to optical conversions which are presently required in optical communication systems.

One area which can present a problem is that of determining and/or controlling the output power of an optical amplifier. This is necessary because the gain of optical amplifiers can be affected by both environmental effects (i.e., changes in ambient temperature) and variations in system variables (i.e., changes in source wavelength and the polarization of the input signal). Another area of concern, when using optical amplifiers at repeater sites of optical communication systems is that of being able to send telemetry command signals to the optical amplifiers and having the optical amplifiers detect the telemetry command signals.

Currently, the power output of an optical amplifier is determined by diverting a portion of the generated optical power by means of an optical coupler and directing the diverted power to an optical detector. A primary disadvantage of this method is that a portion of the optical power generated by the optical amplifier is lost by the monitoring process. Moreover, it involves using a separate detector and a coupler.

SUMMARY OF THE INVENTION

Briefly, in this invention, a photodetector and an optical amplifier are integrated in the same semiconductor chip. The optical amplifier and the photodetector are positioned side-by-side on the same chip. A portion of the electromagnetic energy carried in the evanescent tail of the optical mode is detected by the photodetector for monitoring the average output power of the optical amplifier. Current confinement and lateral index guiding can be provided by Fe or Ti doped semi-insulating layers of InP. The side-by-side arrangement enables the detector to monitor the performance of the optical amplifier without degrading the output power of the optical amplifier.

BRIEF DESCRIPTION OF THE DRAWING

In the FIG. there is illustrated a sectional view of a integrated optical amplifier and photodetector structure in accordance with the principles of the invention.

DETAILED DESCRIPTION

Figure 1:
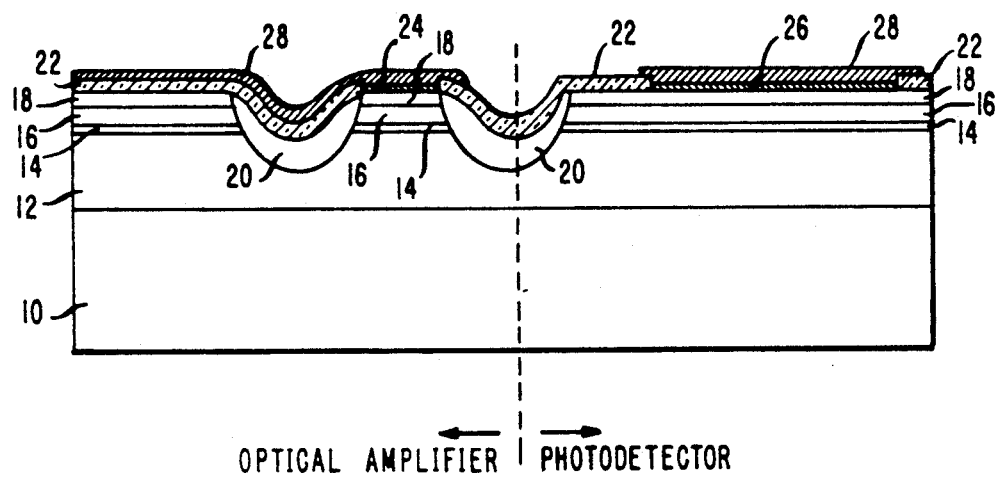

Briefly, a semiconductor optical amplifier can have a structure which is similar to that of a semiconductor laser. In each instance, the structure can be that of a semiconductor diode and its mode of operation is determined by the value of the bias current through the diode. More specifically, if the current which is applied to the diode is relatively low, the active region of the semiconductor diode will glow with light which is emitted spontaneously over a relatively broad spectrum of wavelengths. Light which enters the device from an external source is absorbed. In this mode, the semiconductor diode operates as a light emitting diode.

If the current which is applied to the semiconductor diode is increased slowly, at some value the diode will become transparent to received optical radiation. Thus, light which enters one end of the semiconductor diode will pass through and be emitted from the other end of the semiconductor diode. There is no net absorption of the light. This magnitude of current is called the transparency current. At currents above the transparency current, the semiconductor diode operates as an amplifier. If the value of the current is increased further, the semiconductor diode has a net gain and incident light is intensified or amplified. Further increases in current result in further increases in amplification and in general, the optical gain of the amplifier is an exponential function of the bias current. When the semiconductor is operating in this mode, it spontaneously emits its own light intensity and amplifies that light.

A still further increase in the value of the current to the semiconductor diode will, at some point, cause saturation. Saturation is a deviation of the gain-current relationship from the previously established exponential relationship. Saturation can be caused by many effects including thermally induced reduction in the diode gain, free-carrier absorption, or Auger recombination; however, in a properly designed diode, saturation first appears as a reduction in the gain of the amplifier caused by a loss of carriers from stimulated emission induced by the spontaneously emitted light. If, however; the semiconductor diode is provided with partially reflective end mirrors, the gain will saturate at a current which is less than the saturation current for the case of no mirrors. At this current, the threshold current for lasing operation, the light will resonate back and forth between the two partially reflective end mirrors to stimulate further emission with each pass and, during this process, some of the optical power will pass through the end mirrors as laser light.

Thus, depending on the value of the current which is applied, and upon the reflectivities of the end mirrors or facets, the semiconductor diode will operate as a light emitting diode, an optical amplifier or a laser.

Semiconductor optical amplifiers are often categorized into two classes, one being the Fabry-Perot optical amplifier and the other being the Traveling-Wave optical amplifier. The distinction is a matter of convenience with the term "Fabry-Perot" referring to an amplifier that has partially reflective mirrors. The term "Traveling-Wave" refers to amplifiers operating with a current far below the lasing threshold current. Most practical optical amplifiers operate in a region between these two extremes and henceforth the term "optical amplifier" refers to both types.

In semiconductor optical amplifiers, the gain (the ratio of the output power divided by the input power) is related to the value of the injection current, the reflectivity of the mirrors, the distance between the mirrors and the like. The gain is also dependent on the length of the device and increases as the magnitude of the injection current is increased. More specifically, for a single pass, the gain in an unsaturated optical amplifier increases exponentially as the length of the device is increased or the injection current is increased.

Various conditions affect the gain of a semiconductor optical amplifier. One condition is known as gain saturation. When the gain of a semiconductor optical amplifier is saturated, a further increase in the input signal does not result in a proportional increase in output signal.

Semiconductor optical amplifiers can be used in long-haul optical fiber transmission systems where the information that is being transmitted is represented by encoded light beams which propagate through glass fibers. For error-free transmission, it is imperative that the intensity of the transmitted light beam is maintained within a certain allowable range. This can be accomplished by measuring the power output of the optical amplifier using a separate monitoring photodetector. The monitoring photo detector measures the average power output of the optical amplifier. The signal generated by the photodetector is used to control a feedback circuit which is coupled to adjust the injection current to the optical amplifier to keep the average power output of the optical amplifier within the allowed range. This control of the output power of the optical amplifier is necessary because the output power can change slowly over a period of time as a result of aging, slow degradation or variation of ambient temperature.

Although a separate monitoring photodetector is adequate for most applications, it is desirable to have a photodetector integrated with the optical amplifier in the same semiconductor chip. Some advantages of an integrated optical amplifier-photodetectors are more compact packages and improved integrated multielement optical amplifier arrays which are needed for wavelength multiplexed transmitters. In this invention, a new optical amplifier-photodetector structure is disclosed where the optical amplifier and the photodetector are positioned side-by-side.

Referring to the FIG., there is illustrated a schematic side view of structure in accordance with the principles of the invention. The structure is fabricated by depositing four layers by growth techniques such as liquid phase epitaxy to an n-InP substrate 10 to form a wafer. The four layers can be, for example: an n-InP buffer layer 12, an undoped InGaAsP active layer 14; a p-InP cladding layer 16; and a p-InGaAsP contact layer 18 respectively. Two channels are then etched on the wafer substantially parallel to the (110) direction using a wet or dry chemical etchant and a dielectric mask such as an SiO$_2$ mask which is deposited using photolithographic techniques. Fe-doped semi-insulating InP layers 20 or Ti-doped semi-insulating InP layers 20 can then be selectively grown only in the two channels by metal organic chemical vapor deposition (MOCVD) growth techniques. The presence of the mask prevents nucleation and hence the growth of InP in regions outside of the channel. The wafer is then processed to provide an optical amplifier in one channel and a photodetector in the other channel using standard metallization and photolithographic techniques. The final device is an integrated optical amplifier-photodetector chip.

The optical amplifier and the photodetector in the structure illustrated in the FIG. are "side-by-side". The confinement of the current to the active region in the optical amplifier section is provided by dielectric 22 deposited on the contact layer 18 and by the semi-insulating layer 20 located in the channels. The undoped InGaAsP layer 14 which is bounded by the p-type and n-type InP cladding layers 16,12 serves as both the light emitting region (active region) for the optical amplifier and absorbing region for the photodetector. The optical amplifier contact 24 and photodetector contact 26 on the P-side are isolated by a layer 28 of SiO$_2$.

A new integrated side-by-side optical amplifier-photodetector is disclosed where the optical amplifier and photodetector sections can be isolated from each other by Fe or Ti doped semi-insulating layers of InP. The performance of the optical amplifier is comparable to other types of strongly index guided optical amplifiers which do not have a photodetector; and, the photodetector current tracks the optical amplifier output power. In operation, a portion of the electromagnetic energy carried in the evanescent tail of the optical mode of the optical amplifier is detected by the photodetector. The side-by-side relationship of the optical amplifier-photodetector does not result in the performance of the optical amplifier being degraded or the operation of the photodetector being diminished. The current from the photodetector can be used to monitor the optical amplifier output to provide, with a feedback circuit, stabilization or control of the optical amplifier.

We claim:

1. An integrated optical semiconductor device comprising an optical amplifier integrated with a photodetector on a wafer comprising a substrate, a buffer layer of n-InP on said substrate, an active layer of undoped InGaAsP on said buffer layer, a cladding layer of p-InP on said active layer and a contact layer of p-InGaAsP on said cladding layer, said wafer having a first etched channel and a second etched channel, said first and second channels being positioned side by side, a doped semi-insulating layer in said first channel and in said second channel, said optical amplifier being in said first channel in said wafer, and said photodetector being in said second channel in said wafer, the side by side spacing of said photodetector and said optical amplifier being such that said photodetector receives a portion of spontaneous emission generated by said optical amplifier.

2. The device of claim 1 wherein said doped semi-insulating layer in said first channel and said second channel each comprises InP doped with a material selected from the group consisting of Fe.

3. The device of claim 1 wherein said doped semi-insulating layer in said first channel and said second channel each comprises InP doped with a material selected from the group consisting of Ti.

4. The device of claim 1 wherein the first and second channels are substantially parallel to 110 direction.

* * * * *